United States Patent
McGee

(10) Patent No.: US 12,244,199 B2
(45) Date of Patent: Mar. 4, 2025

(54) ELECTROMAGNETIC OPTICAL SHUTTER WITH MOVABLE PERMANENT MAGNET AND INTEGRATED APERTURE

(71) Applicant: Ocean Optics, Inc., Orlando, FL (US)

(72) Inventor: Brian McGee, Orlando, FL (US)

(73) Assignee: OCEAN OPTICS, INC., Orlando, FL (US)

( * ) Notice: Subject to any disclaimer, the term of this patent is extended or adjusted under 35 U.S.C. 154(b) by 344 days.

(21) Appl. No.: 17/806,228

(22) Filed: Jun. 9, 2022

(65) Prior Publication Data
US 2023/0402908 A1    Dec. 14, 2023

(51) Int. Cl.
| | | |
|---|---|---|
| H02K 33/16 | (2006.01) |
| H01F 7/06 | (2006.01) |
| H01F 27/30 | (2006.01) |
| H02K 1/34 | (2006.01) |
| H02K 3/26 | (2006.01) |
| H02K 41/02 | (2006.01) |
| H05K 1/11 | (2006.01) |
| H05K 1/18 | (2006.01) |
| G01J 1/04 | (2006.01) |
| G02B 26/02 | (2006.01) |

(52) U.S. Cl.
CPC ............ *H02K 33/16* (2013.01); *H01F 7/064* (2013.01); *H01F 27/306* (2013.01); *H02K 1/34* (2013.01); *H02K 3/26* (2013.01); *H02K 41/02* (2013.01); *H05K 1/115* (2013.01); *H05K 1/185* (2013.01); *G01J 1/044* (2013.01); *G02B 26/02* (2013.01)

(58) Field of Classification Search
CPC ...... H01H 50/38; H01H 50/54; H01H 50/546; H01H 9/443
See application file for complete search history.

(56) References Cited

U.S. PATENT DOCUMENTS

| | | |
|---|---|---|
| 2,702,500 A | 3/1952 | Bell |
| 5,159,382 A | 10/1992 | Lee |
| 5,606,387 A | 2/1997 | Furlani et al. |
| 6,033,131 A | 3/2000 | Ghosh et al. |
| 8,786,855 B2 | 7/2014 | Demmer et al. |
| 9,281,733 B2 | 3/2016 | Stephenson |
| 9,671,676 B2 | 6/2017 | Agapescu |
| D825,363 S | 8/2018 | Ave |
| 2001/0055188 A1 | 12/2001 | Belfatto, Sr. et al. |
| 2017/0003167 A1 | 1/2017 | Ave |
| 2017/0343413 A1 | 11/2017 | Ave |

OTHER PUBLICATIONS

No Author. (Inline-TTL-S) Electronic TTL Shutter for Mounting Between Fibers, https://whitebearphotonics.com/products/inline-ttl-s (Downloaded Jun. 9, 2022) pp. 1-3.
No Author. Uniblitz® Optical Shutter Systems, https://www.uniblitz.com/shutter-series-overview/ (Downloaded Jun. 9, 2022) pp. 1-7.
No Author. Ocean Insight: QE Pro Internal Shutter Adds Convenience. Ocean Insight News, (Downloaded Jun. 9, 2022) pp. 1-5.

*Primary Examiner* — Bernard Rojas
(74) *Attorney, Agent, or Firm* — Perkins Coie LLP

(57) ABSTRACT

This patent document provides optical shutter devices based on electromagnetically activated shutters using a printed circuit board ("PCB") structure to provide a coil that generates a magnetic field to move a permanent magnet in and out of an optical aperture integrated as part of the PCB structure to open and close the passage of light through the optical aperture.

19 Claims, 14 Drawing Sheets

Electromagnetic Shutter
with
Permanent Magnet and Integrated Aperture

Electromagnetic Shutter with Permanent Magnet and Integrated Aperture

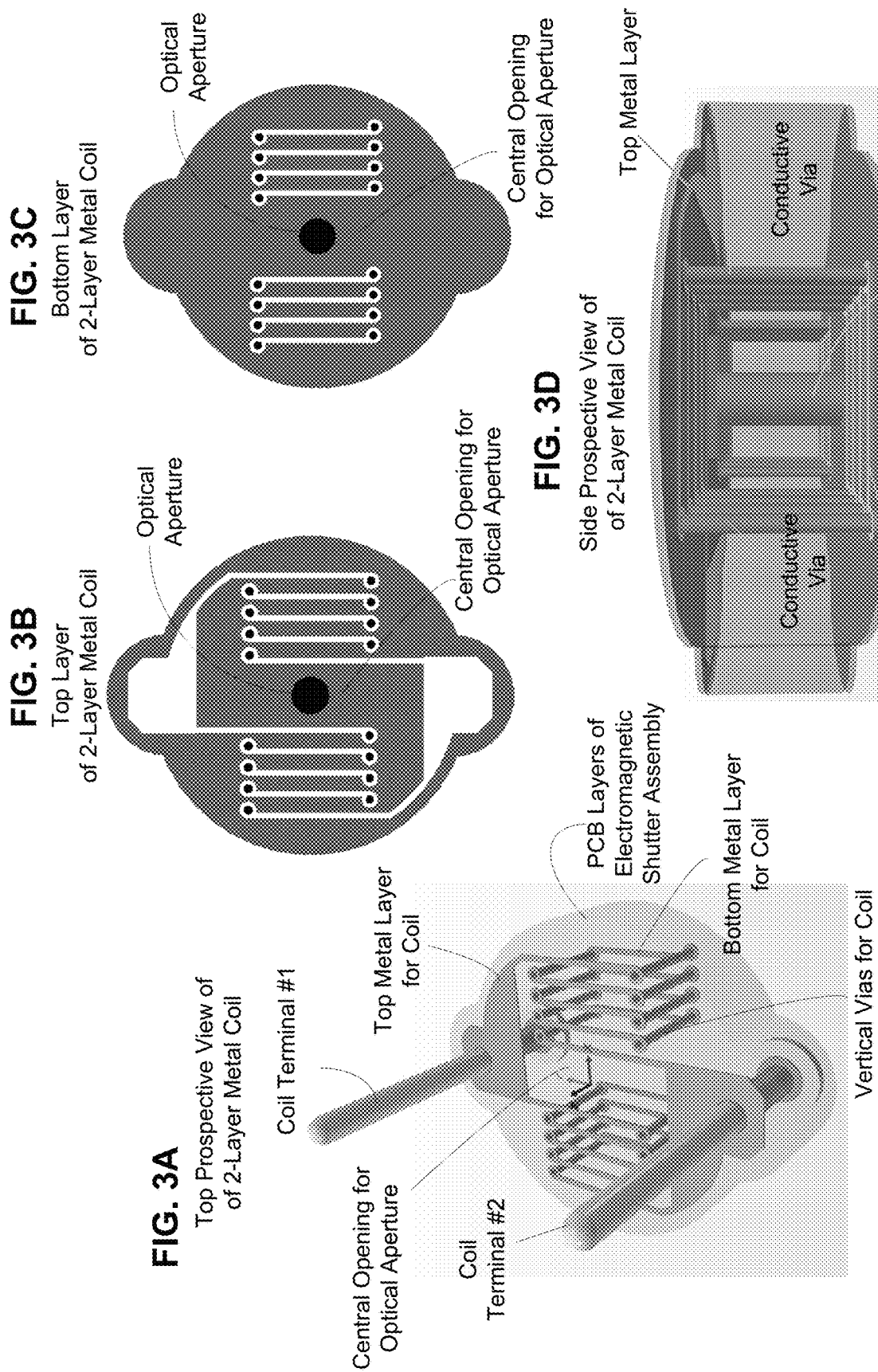

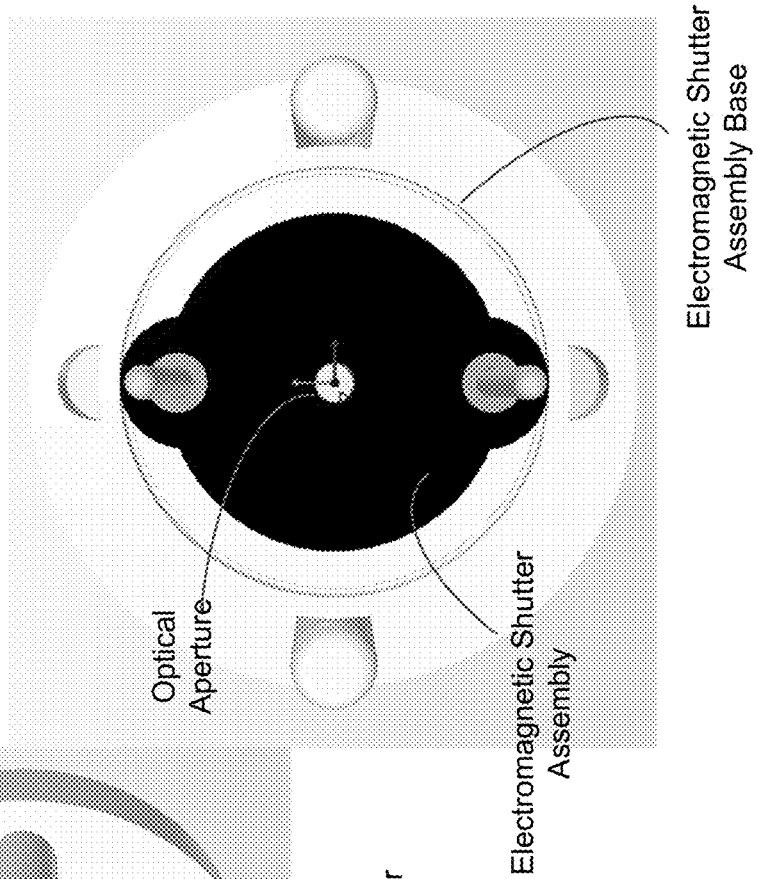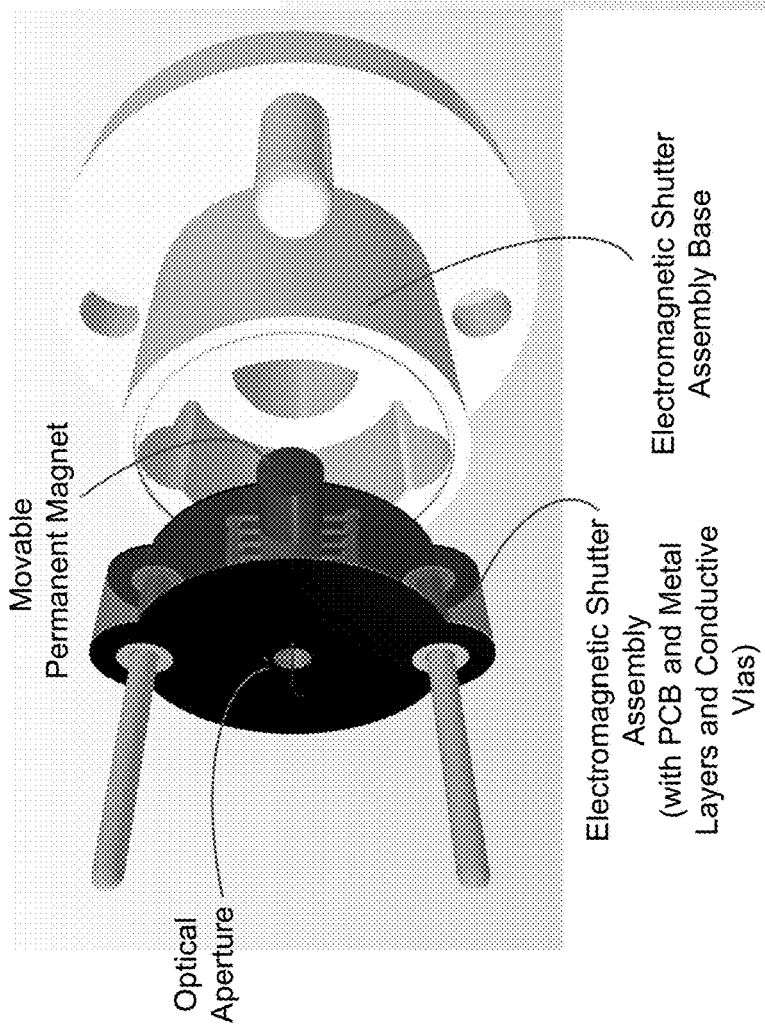
FIG. 4A
FIG. 4B
Electromagnetic Shutter with Permanent Magnet and Integrated Aperture Electromagnetic Shutter
with
Permanent Magnet and Integrated Aperture Top Metal Layer for Coil Top Inner Metal Layer 1 for Coil Top Inner Metal Layer 2 for Coil Bottom Inner Metal Layer 2 for Coil Bottom Inner Metal Layer 1 for Coil Bottom Metal Layer for Coil

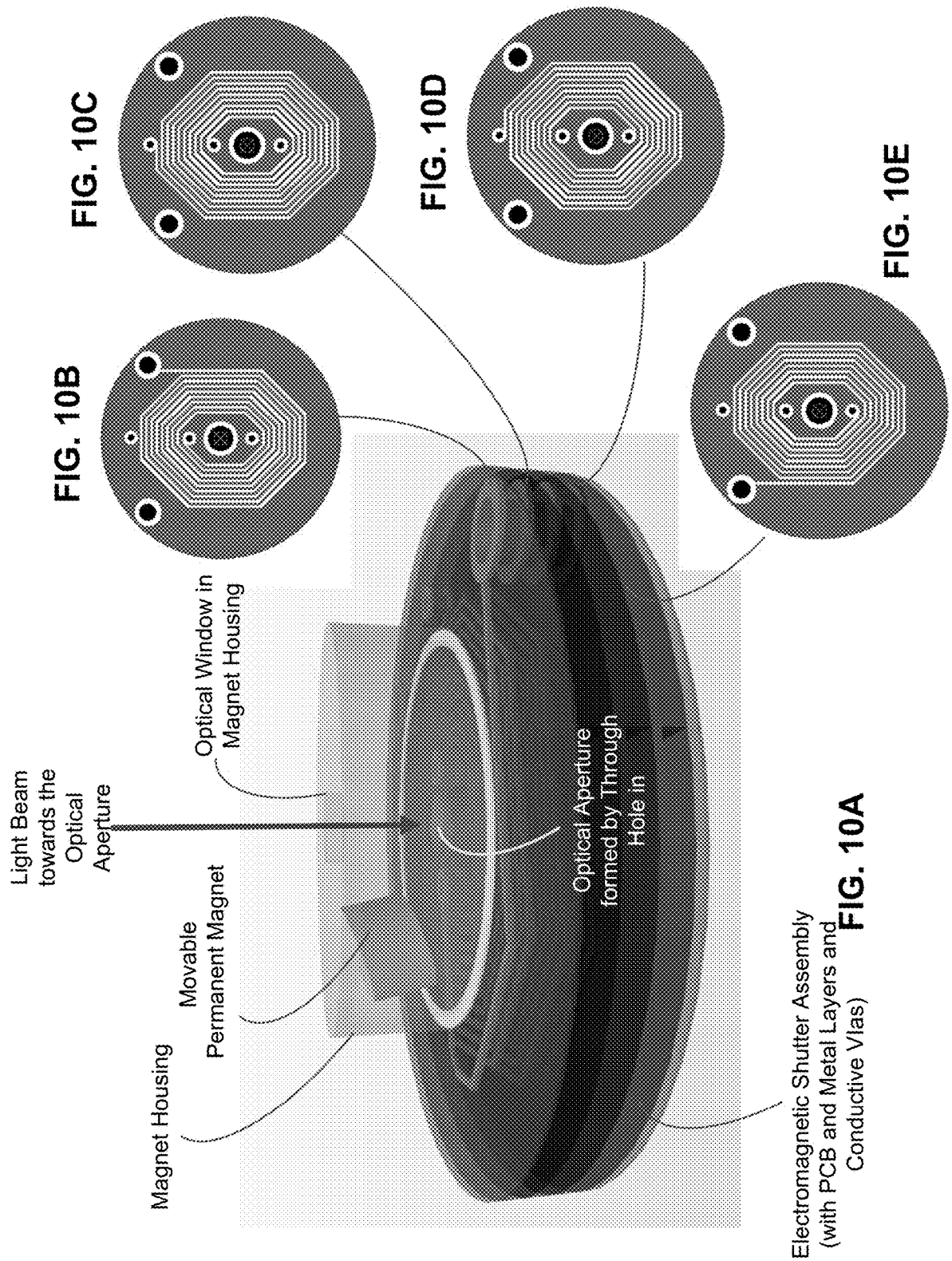

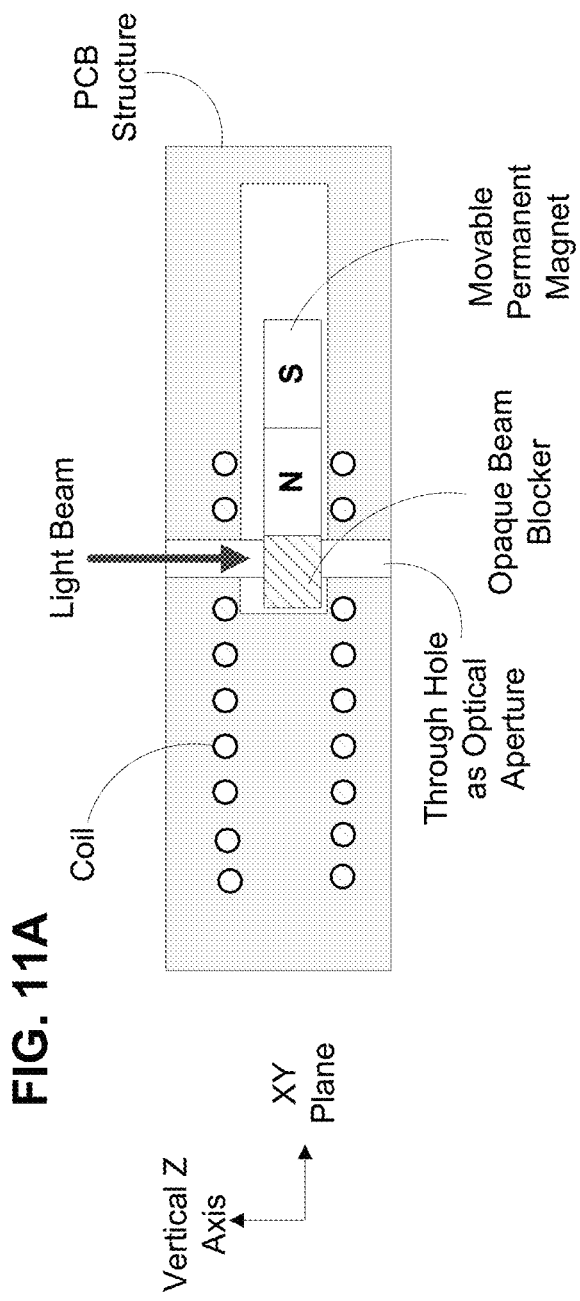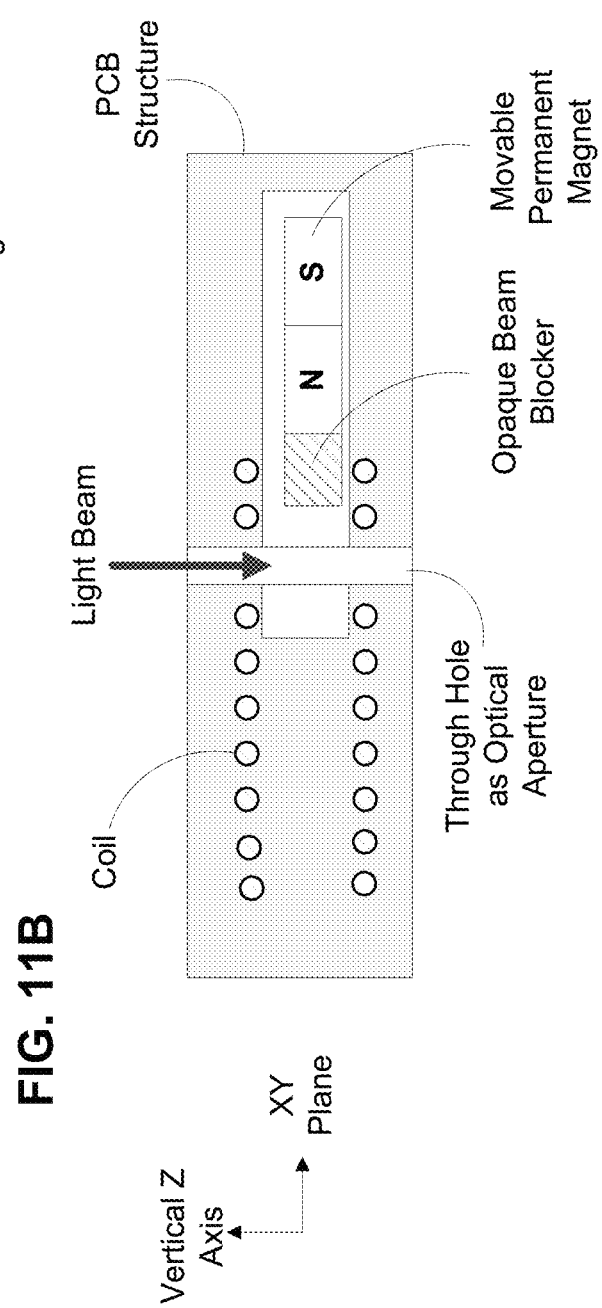

ELECTROMAGNETIC OPTICAL SHUTTER WITH MOVABLE PERMANENT MAGNET AND INTEGRATED APERTURE

TECHNICAL FIELD

This patent document relates to optical shutter devices that open or close an optical path through an optical aperture in various optical devices and systems.

BACKGROUND

Optical shutters are used to allow light to pass through an optical path or to block the transmission of the light along the optical path and are widely used in optical devices and systems

SUMMARY

This patent document provides examples of designs, operations and fabrication of optical shutter devices based on electromagnetically activated shutters using a printed circuit board ("PCB") structure to provide a coil that generates a magnetic field to move a permanent magnet in and out of an optical aperture integrated as part of the PCB structure to open and close the passage of light through the optical aperture. Optical shutter devices based on implementations of disclosed designs can be made to achieve certain desirable features, including, e.g., compact in size, robust in construction, reliable in operation and relatively low costs in comparison to various other actuated optical shutter devices. In some implementations, the disclosed optical shutter devices can be used with light in free space. In other implementations, the disclosed optical shutter devices can be structured to be amounted to various base mounts fit for various structures where an optical aperture is implemented, including base mounts widely used in commercial fiber optical components such as SubMiniature version A (SMA) connectors.

In one aspect, for example, the disclosed technology can be implemented to provide a device that includes an optical shutter device for providing a shutter operation in an optical path. This optical shutter device includes a printed circuit board (PCB) structure formed of a PCB dielectric material and structured to include (1) first and second surfaces that oppose each other on two opposite sides of the PCB structure, (2) one or more first metal layers located at or near the first surface to include first metal conductive lines, (3) one or more second metal layers located at or near the second surface to include second metal conductive lines and spaced away from the one or more first metal layers by a body of the PCB dielectric material, and (4) a plurality of electrically conductive vias formed inside the PCB structure and structured and connected to provide electrical connections through the PCB dielectric material between the one or more first metal layers and the one or more second metal layers to form a coil of a winding electrical conductive path with the first and second metal conductive lines so that the coil has a coil direction parallel to the first and second surfaces, wherein the coil is connected to receive an electrical current to induce a magnetic field whose magnetic poles are controlled by a direction of the electrical current in the coil. This optical shutter device further includes a channel formed in the PCB structure and located between the first and second surfaces within the coil and structured to extend along the coil direction; a permanent magnet shaped to be placed in the channel within the coil to be movable along the channel in response to a direction and a magnitude of the electrical current in the coil; and a through hole formed in the PCB structure to penetrate through the PCB dielectric material between the first and second surfaces and located to pass through a part of the channel so that the through hole can be opened or closed as an optical shutter by a movement of the permanent magnet in the channel in response to the electrical current in the coil.

In another aspect, for example, the disclosed technology can be implemented to provide a device that includes an optical shutter device for providing a shutter operation in an optical path. The optical shutter device includes a printed circuit board (PCB) structure formed of a PCB dielectric material and structured to include (1) first and second surfaces that oppose each other on two opposite sides of the PCB structure, (2) a plurality of different metal layers that are separated from each other and located near the first surface, wherein each metal layer includes a contiguous metal trace structured as a spiral, and (3) a plurality of electrically conductive vias formed inside the PCB structure and structured and connected to provide electrical connections through the PCB dielectric material to connect the spirals of the contiguous metal traces of different metal layers in series. The spirals of the contiguous metal traces of different metal layers in series are coupled to receive an electrical current to induce a magnetic field whose magnetic poles are controlled by a direction of the electrical current. This optical shutter device further includes a permanent magnet placed over the first surface of the PCB structure to be movable over the first surface in response to a direction and a magnitude of the electrical current; a through hole formed in the PCB structure to penetrate through the PCB dielectric material between the first and second surfaces so that the through hole can be opened or closed as an optical shutter by a movement of the permanent magnet in response to the electrical current; and a housing engaged to the first surface of the PCB structure to cover the through hole and to confine the movement of the permanent magnet around the through hole so that the permanent magnet is movable over the first surface to either be away from the through hole or block the through hole. The housing is structured to allow light to be directed to the through hole.

The drawings, the description and the claims below provide a more detailed description of the above and other aspects, their implementations and features of the disclosed technology.

BRIEF DESCRIPTION OF THE DRAWINGS

FIGS. 3A, 3B, 3C and 3D show features of an example of an optical shutter device formed in a printed circuit board (PCB) structure with two metal layers for implementing the disclosed technology.

FIGS. 4A and 4B illustrate one example for mounting an optical shutter device for implementing the disclosed technology into a base mount such as a SMA connector.

FIGS. 10A, 10B, 10C, 10D and 10E show an example of an optical shutter device formed in a printed circuit board (PCB) structure for implementing the disclosed technology to construct a planar coil with an electromagnetic induced magnetic field that is substantially perpendicular to the surface of the PCB.

FIGS. 11A and 11B show one example for using an opaque beam blocker which is attached to one end of the movable permanent magnet.

DETAILED DESCRIPTION

The operation of opening or closing an optical aperture in an optical path is a fundamental feature in certain optical devices and systems and there have been various optical shutter designs available. Some of existing optical shutter designs may be bulky in size and thus are not suitable for optical shutter applications that require compact shutter devices. Some of existing optical shutter designs with moving parts may not be sufficiently robust in the construction and thus tend to be subject to failures over repeated operations. Reliability of optical shutter devices with moving parts can be a challenging technical issue in various optical shutter device designs.

The optical shutter devices based on the disclosed technology in this patent document use a printed circuit board ("PCB") structure to provide a platform to integrate a conductive coil formed by metal conductive line and conductive vias embedded in the PCB dielectric material, an optical aperture in form of a through hole in the PCB material and a movable permanent magnet in a channel formed within the PCB material as a compact, robust and reliable optical shutter device with a dimension of the shutter packaging under 10 millimeters in some implementations. The channel can be formed in the PCB material for holding a movable magnet that is moved between "open" and "close" positions for the optical aperture by controlling the current supplied to the coil. Since the components are embedded or integrated to the PCB material, the structure of the shutter device is mechanically simple and electrically robust. Such shutter devices can be fabricated with matured PCB manufacturing processes and well-developed and inexpensive PCB materials with a cost of the device potentially being no more than $10-20 dollars. The coil is coupled to a coil circuit that supplies a current which generates a magnetic field to move a permanent magnet in and out of an optical aperture integrated as part of the PCB structure by controlling the direction and magnitude of the current in the coil. In addition, the entire PCB-based shutter device can be a replaceable module at a low cost for an optical device or system so that a failed shutter device can be easily replaced without requiring complex and time consuming repairing or servicing process.

Figure 1B:
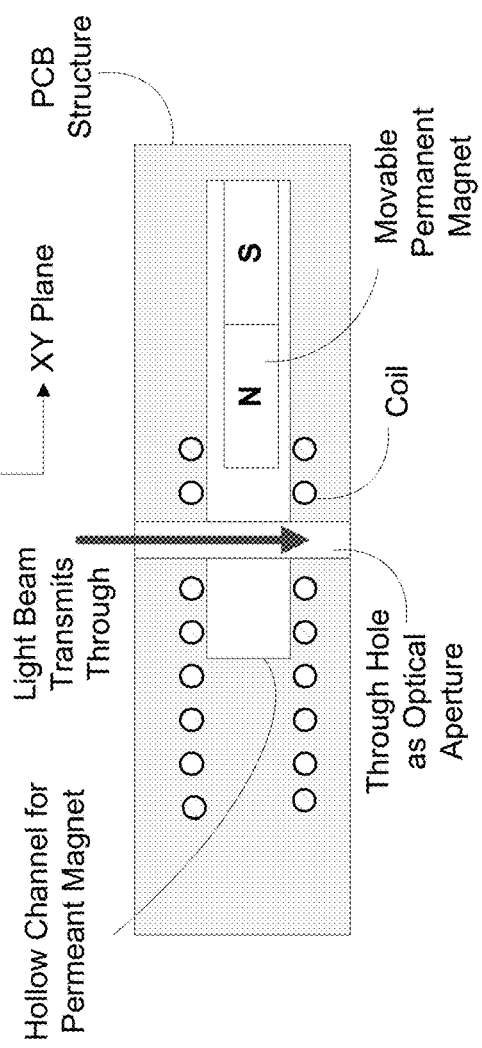
FIGS. 1A, 1B and 1C show features of an example of an optical shutter device formed in a printed circuit board (PCB) structure for implementing the disclosed technology.
Figure 1C:
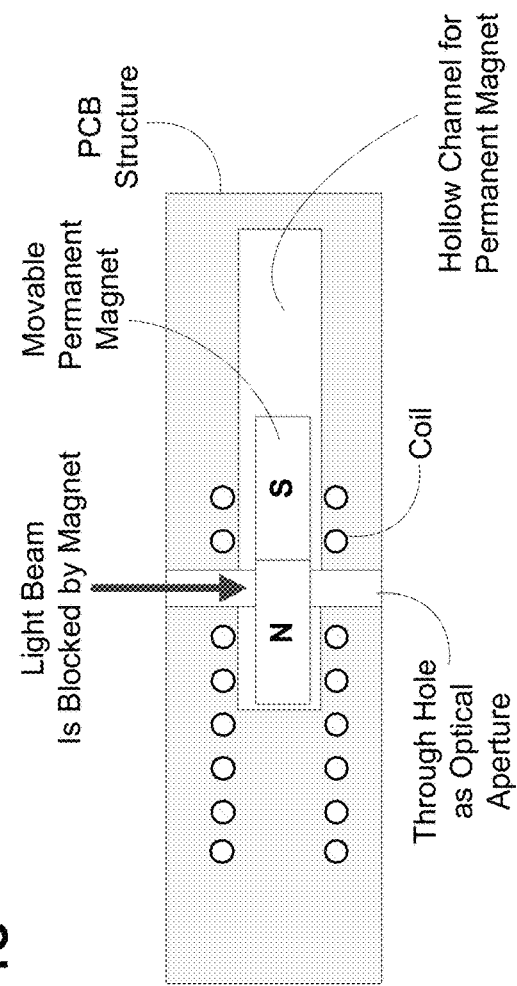
Figure 1A:
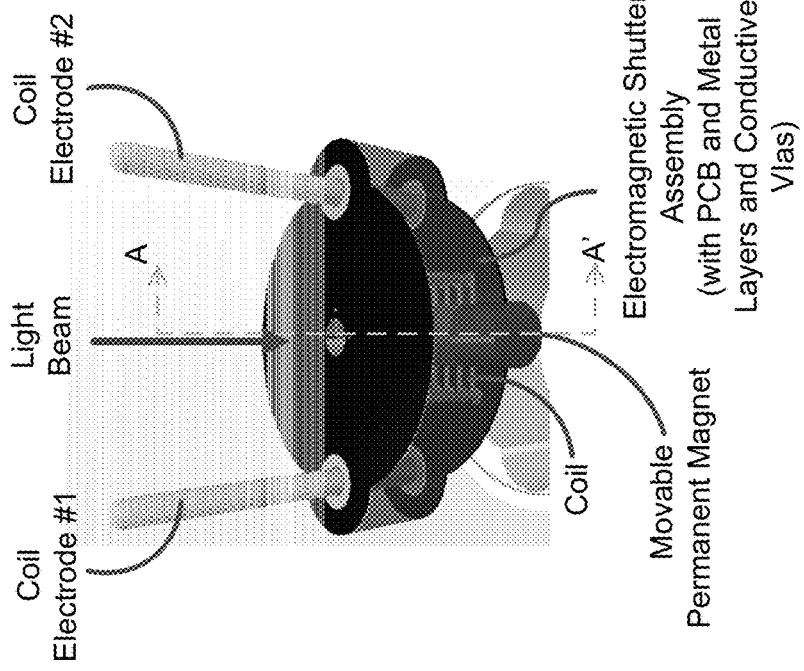

FIGS. 1A, 1B and 1C show features of an example of an optical shutter device formed in a printed circuit board (PCB) structure for implementing the disclosed technology. FIG. 1A shows the overall package of this particular example formed on a printed circuit board (PCB) structure. The PCB structure is formed of a PCB dielectric material (e.g., FR4 materials) and structured to include a multi-layer PCB body with layers of the PCB material and metal layers embedded in the PCB material. As illustrated, the layers in the PCB structure are in the XY plane and the normal direction to the PCB layers is in the Z direction. The PCB structure has a top surface (first surface) with openings for the first and second electrode terminals for the coil embedded inside the PCB structure and a bottom (second) surface on the opposite side. The two electrode terminals are coupled to a shutter circuit that supplied a current to the coil to drive the shutter device. The metal layers embedded in the PCB material include (1) one or more first metal layers located at or near the first surface on the top to include first metal conductive lines and (2) one or more second metal layers located at or near the second surface on the bottom to include second metal conductive lines and spaced away from the one or more first metal layers by the PCB dielectric material to accommodate for holding the moveable magnet. To form the contiguous conductive path for the coil using the first and second metal conductive lines, different electrically conductive vias in the vertical direction are formed inside the PCB structure and are structured and connected to provide electrical connections through the PCB dielectric material between the one or more first metal layers and the one or more second metal layers to form a coil of a winding electrical conductive path with the first and second metal conductive lines.

FIGS. 1B and 1C show a cross sectional view of the shutter device in FIG. 1A along line A-A' in the XY plane and illustrate two different positions of the magnet. As shown, a hollow channel is formed in the PCB structure between the first and second surfaces and is located within the coil to extend along the coil direction within the XY plane. The permanent magnet is placed in the channel within the coil to be movable along the channel in response to a direction and a magnitude of the electrical current in the coil. The optical aperture is formed by having a through hole formed in the PCB structure to be generally along the Z direction and extend in a direction approximately perpendicular to the XY plane. The through hole penetrates through the PCB dielectric material between the first and second surfaces and is positioned to pass through a part of the channel so that the through hole can be opened or closed by placing the permanent magnet at a desired position in the channel to either be away from the through hole or to block the through hole. Specifically, FIG. 1C shows that the magnet is moved to a position at which it blocks the through hole in the PCB to close the optical shutter and FIG. 1B shows the magnet is moved to a side to expose the through hole so the light can pass through the shutter.

Figure 2A:
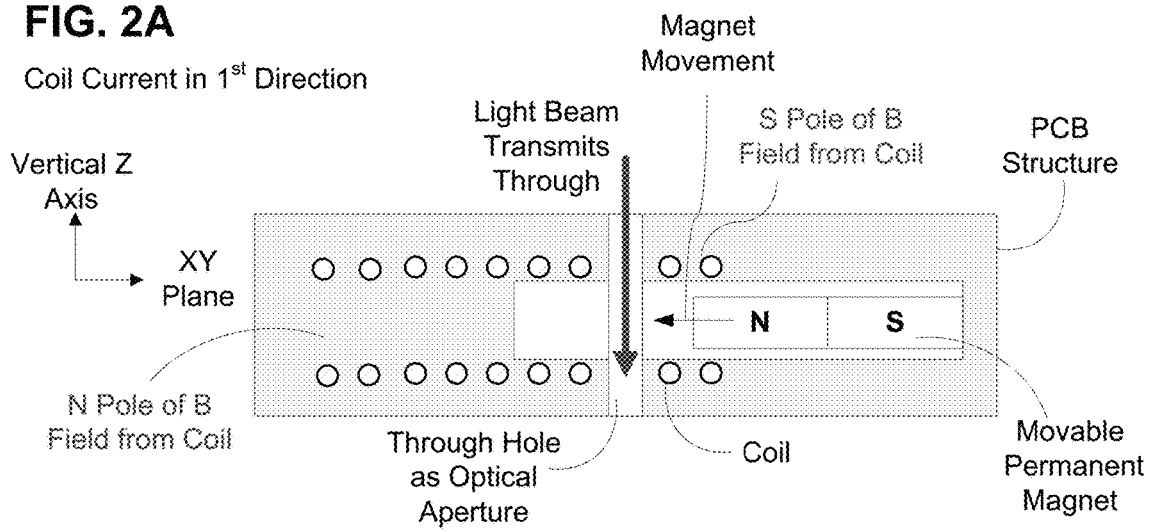
FIGS. 2A, 2B and 2C illustrate operations and positions of a permanent magnet in the optical shutter device based on the disclosed technology.
Figure 2B:
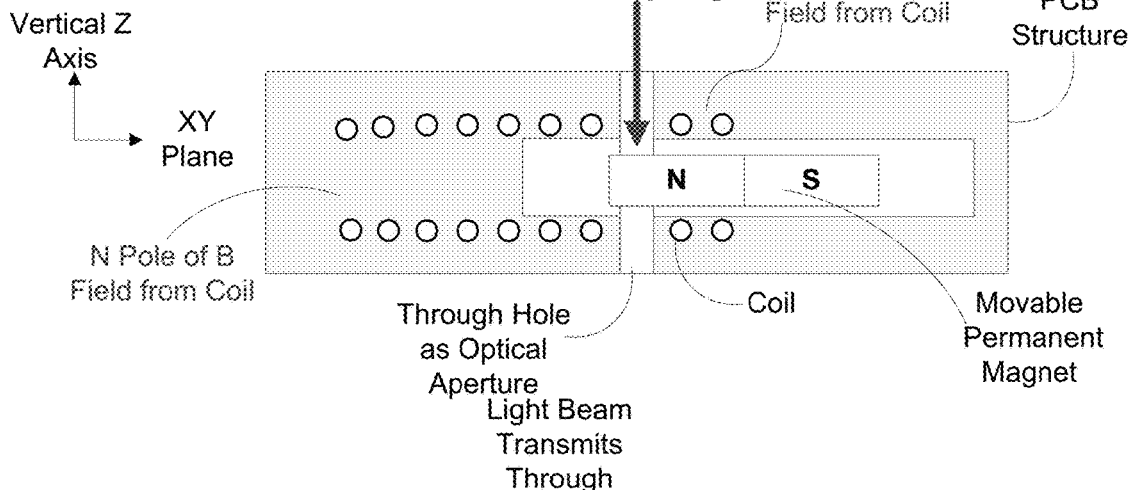
Figure 2C:
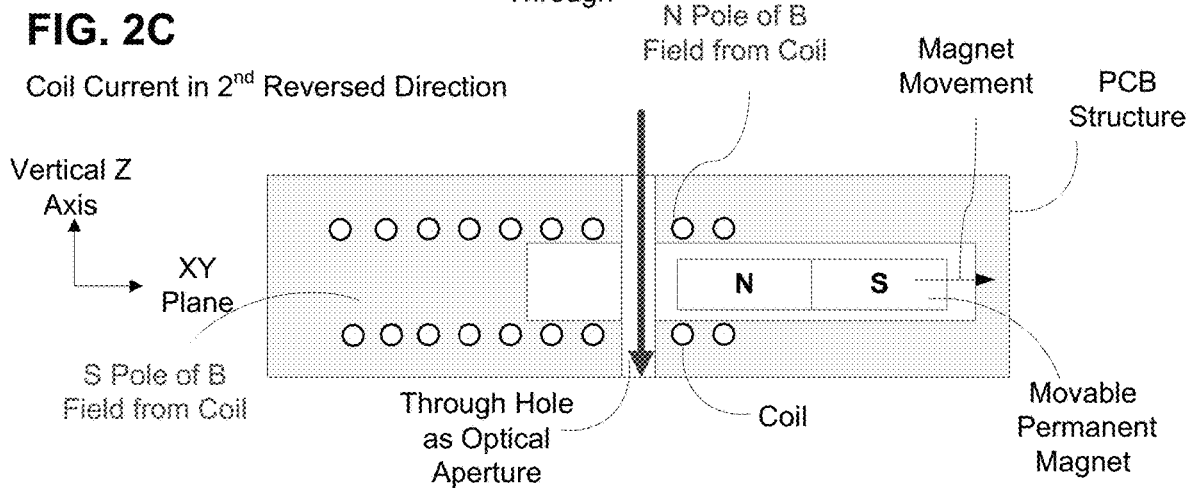

A coil control circuit is coupled to the coil to supply a current and to control magnitude and direction of the current in the coil to generate an induced magnetic field to move the permanent magnet in opening and closing the optical shutter. FIGS. 2A and 2B show the coil current is in a first direction in the coil to cause the coil to produce a magnetic field B with its North pole on the left hand side and the South pole on the right hand side. The movable permanent magnet is initially placed at the illustrated position at the right hand side end of the hollow channel with its North pole facing the coil. Under this first current direction, the magnetic force induced between the coil's magnetic field and the magnet will attract the magnet to draw the magnet into the coil towards the left to reach a position as shown in FIG. 2B. Next, when coil control circuit is operated to reverse the current direction in the coil in the second direction to reverse the positions of its North and South poles as shown in FIG. 2C, this change in the current direction causes the magnetic field B produced by the coil to expel the magnet that is already in the coil to out of the coil towards the right hand side as shown in FIG. 2C and this movement of the magnet causes the optical aperture to be open again. This control of the direction of the current in the coil can be used to place the magnet at different positions for opening or closing the optical shutter.

FIGS. 3A, 3B and 3C show features of an example of an optical shutter device formed in a printed circuit board (PCB) structure with two metal layers for forming the coil in implementing the disclosed technology. FIG. 3A shows a perspective view of metal conductive lines in the top and bottom metal layers and the vertical conductive vias that are embedded in the PCB material. The top and bottom metal layers are patterned to form first conductive metal lines in the top metal layer and second conductive metal lines in the bottom metal layer. FIGS. 3B and 3C show, respectively, the first conductive metal lines in the top metal layer and the second conductive metal lines in the bottom metal layer. FIG. 3A shows placement and locations of vertical conductive vias that connect first conductive metal lines in the top metal layer and second conductive metal lines in the bottom metal layer to form a winding and contiguous conductive path as the coil to receive the input electrical current via the two coil terminals 1 and 2 as shown. Specifically in this example, the coil has two coil sections with generally even spaced metal windings and those two sections are spaced from each other with a central opening area between them and the through hole is formed in this central opening area as the optical aperture. A hollow channel is formed in the PCB material inside the coil for placing the movable permanent magnet that is driven by the magnetic field included by the coil when the current is applied. This hollow channel embedded in the PCB material is formed by removing part of the PCB dielectric material and is oriented approximately perpendicular to the through hole as shown in FIGS. 1B and 1C to intercept and cross the through hole. The movable permanent magnet is shaped to movably fit inside the hollow channel and is confined by the hollow channel so that North and South poles of the movable permanent magnet are aligned along the hollow channel as shown in FIGS. 1B and 1C. The dimension of the cross section of the hollow channel is slightly bigger than the cross section of the movable permanent magnet so the movable permanent magnet can freely move around in the hollow channel along the elongated direction of the hollow channel. FIG. 3D further shows a side perspective view along the coil direction without showing the hollow channel. In some designs, the hollow channel formed in the PCB structure has a width of between 0.5 mm and 1 mm.

This and other PCB-based optical shutter devices disclosed in this patent document may be made to be compact in size, robust in construction, and reliable in operation. The metal conductive lines and the vias are embedded in the PCB structure and thus are well insulated and robust in their construction. The magnet is controlled by the electromagnetic interactions between the magnet and the magnetic field of the coil and thus only needs a simple current supply circuit without complex electronics. The entire device is based on a commercially matured PCB design and construction and thus can be fabricated at relatively low costs.

In implementations, the walls of the hollow channel and the exterior surface of the permanent magnet may be structured to reduce a friction caused by the movement of the magnet in the hollow channel. For example, the wall surfaces and exterior surface of the permanent magnet may be coated to reduce the friction. For example, the exterior of the permanent magnet or/and the wall surfaces of the hollow channel may be coated with a coating layer that includes a polymer coating (e.g., parylene) or a metal coating (e.g., nickel). The permanent magnet may be implemented by various suitable magnetic materials including, e.g., magnetic materials that include neodymium (e.g., a N52 neodymium material), or a combination of samarium and cobalt. In some implementations, the PCB structure may a lateral dimension from 3 mm to 7 mm along the PCB surface.

The geometry and dimensions of such a PCB-based electromagnetic optical shutter can be designed to allow for easy installation or mounting to an optical device. FIGS. 4A and 4B illustrate one example for mounting an optical shutter device based on the disclosed technology into a base mount such as a SMA connector.

Figure 5B:
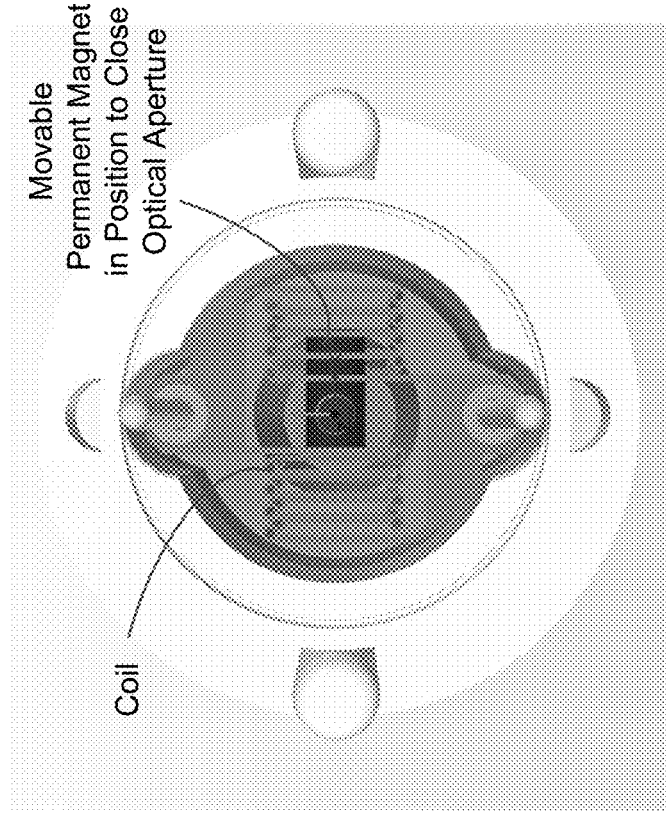
FIGS. 5A and 5B show two positions of the permanent magnet in the optical shutter device example in FIGS. 3A, 3B and 3C to show the "open" and "close" modes of the optical shutter.
Figure 5A:
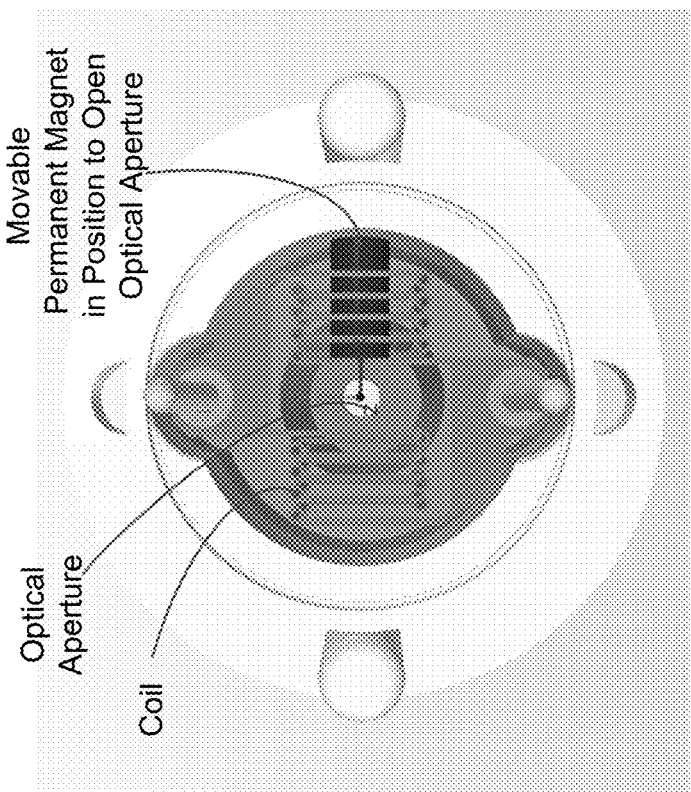

Such an optical shutter device can be structured to be amounted to various base mounts fit for various structures where an optical aperture is implemented, including base mounts widely used in commercial fiber optical components such as SubMiniature version A (SMA) connectors. FIGS. 4A and 4B illustrate one example for mounting an optical shutter device into a base mount such as a SMA connector. FIG. 4A shows the SMA connector with a cylindrical socket to have a hollow interior to receive and engage the PCB-based optical shutter device at a fixed position. FIG. 4B shows the PCB-based optical shutter device sits in cylindrical socket of the SMA connector to naturally place the optical aperture at the center of the SMA connector. FIGS. 5A and 5B illustrate two positions of the permanent magnet in the PCB-based optical shutter device to open the optical aperture (FIG. 5A) and to close the optical aperture (FIG. 5B).

Figure 6:
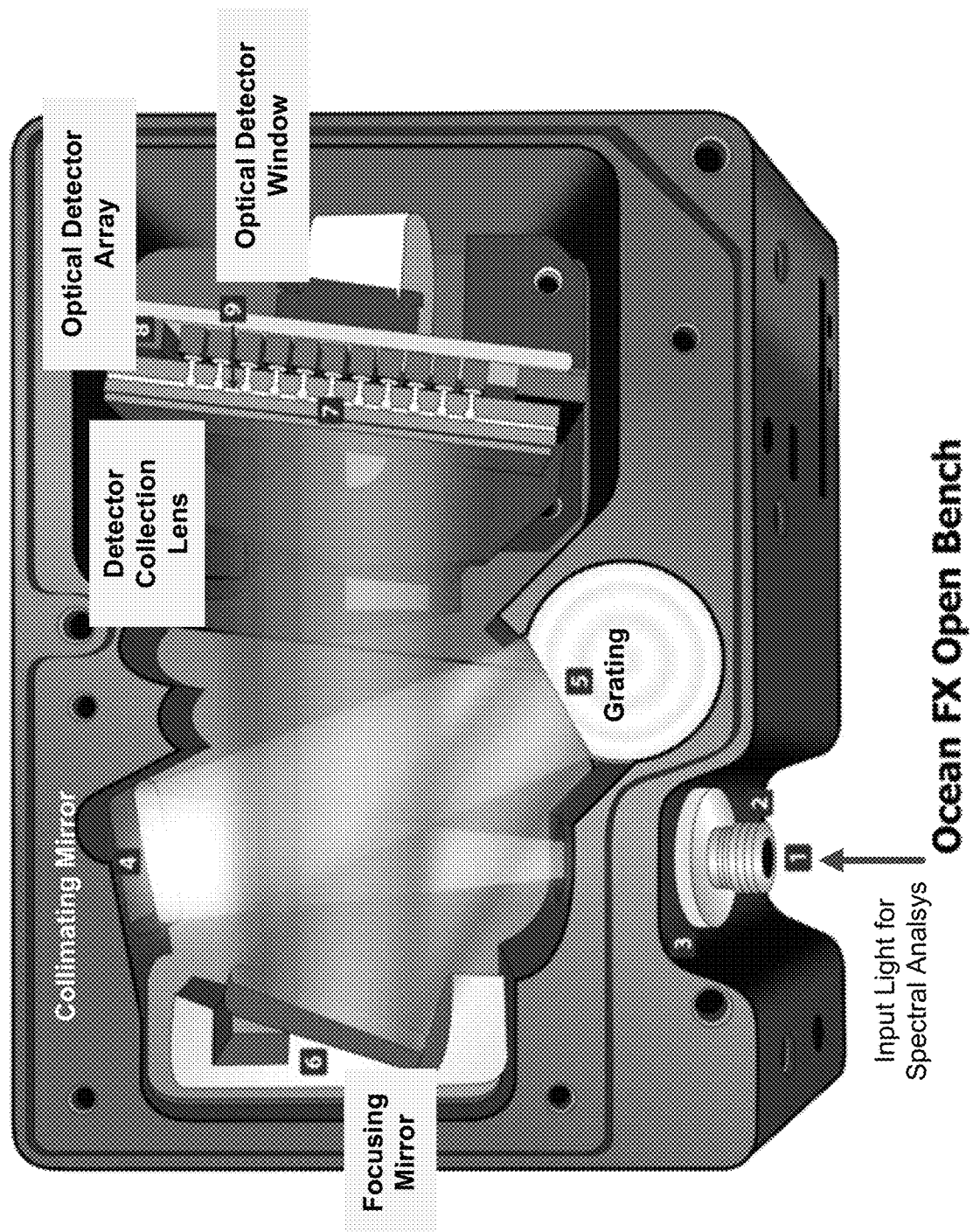
FIG. 6 illustrates an example of an optical spectrometer which implements an optical shutter device at the entrance slit based on the disclosed technology.

FIG. 6 shows an example of an optical spectrometer with an optical input port based on a SMA connector which can be used to provide a fiber coupled input for the input light to be received by the spectrometer for detection and analysis. The PCB-based optical shutter device shown in FIGS. 4A, 4B, 5A and 5B can be easily implemented in such an optical spectrometer without undergoing complex installation and alignment processes. As shown in FIG. 6, this optical spectrometer example uses a folded optical path configuration to process the received input light from the optical input SMA connector for spectral measurements. The received input light from the optical input SMA connector (1) to a collimating mirror (4) which transforms the input light into a collimated light beam towards an optical grating (5) which diffracts the received collimated light beam into different diffracted light beams based on their optical wavelengths at different diffraction directions. The propagation of such different diffracted light beams at the different diffraction directions spatially separates the different diffracted light beams to allow for optical detection and spectral measurements. The different diffracted light beams at the different diffraction directions are directed to a focusing mirror (6) which re-directs and focuses the different diffracted light beams towards optical detectors in an optical detector array (8) generally implemented by a semiconductor detector array such as a CMOS detector array or CCD detector array. The focusing mirror (6) may be designed to focus the first-order spectra on the detector plane. In front of the optical detector array (8), a detector collection lens (7) may be provided to focus the received light onto the different optical detectors, thus increasing light-collection efficiency and reducing optical loss in detection by reducing stray light. A detector optical window (9) may also be provided by using an optical window with opaque borders to allow the desired first order diffraction light to pass through while blocking light in the second and higher diffraction orders from entering the optical detector. The use of the optical shutter in an optical spectrometer allows blocking light from entering into the instrument for calibrating the instrument's dark current reference operation to improve the spectrometer performance. The permanent magnet used in the optical shutter device inside the optical input SMA connector (1) is optically opaque to light in wavelengths in a wide spectrum from UV to far infrared and thus can shut off and turn on light in this wide spectrum.

Figure 7A:
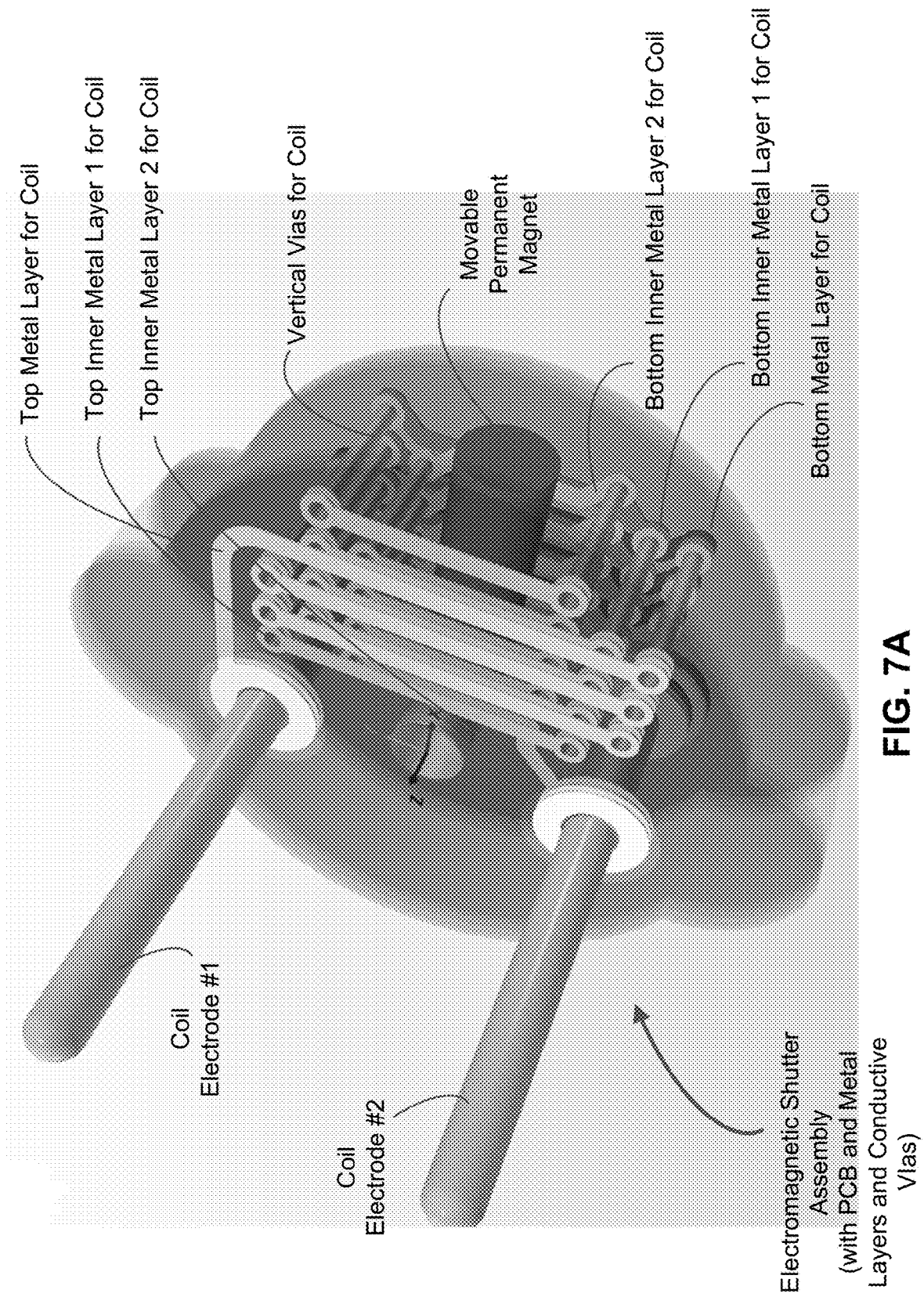
FIGS. 7A, 7B and 7C show an example of a PCB supported optical shutter device with 6 metal layers in the PCB structure.
Figure 7B:
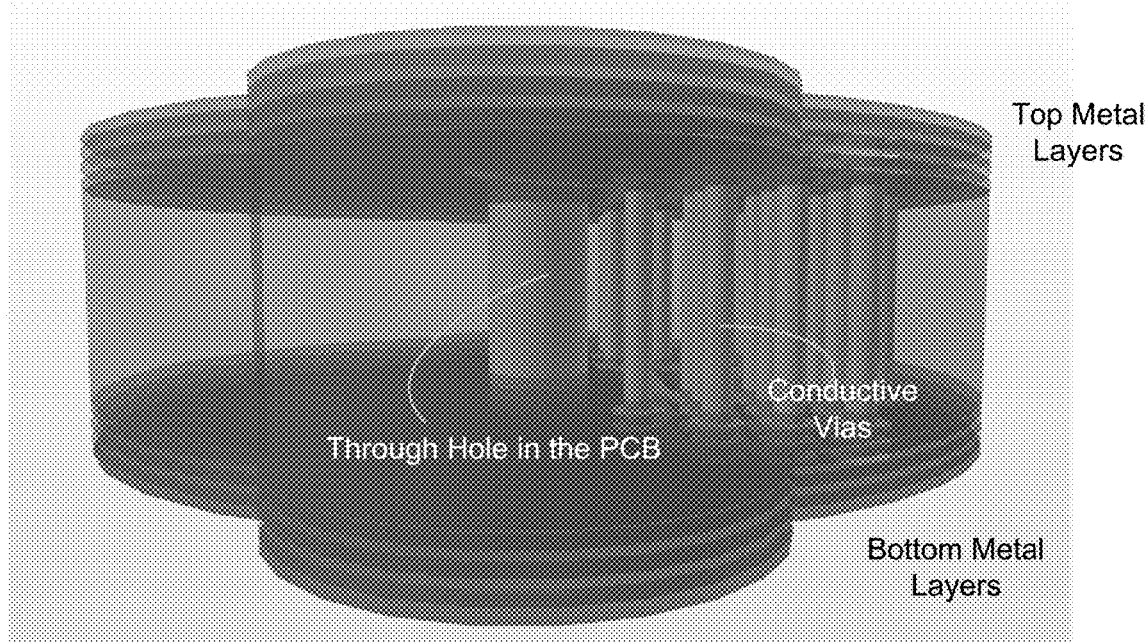
Figure 7C:
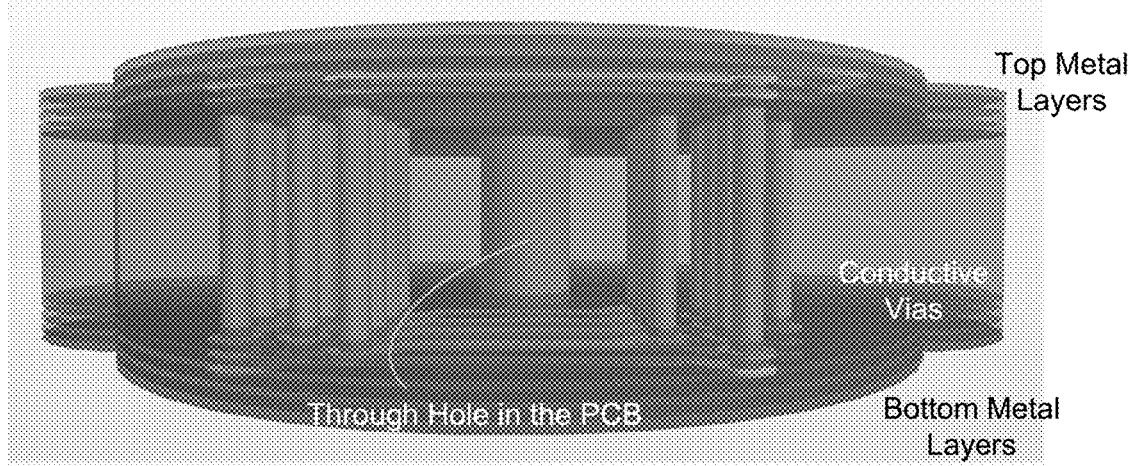

FIGS. 7A, 7B and 7C show an example of a PCB supported optical shutter device with 6 metal layers in the PCB structure. FIG. 7A illustrates the shapes and locations of metal conductive lines of (1) the top metal layer near the upper PCB surface, (2) the top inner metal layer 1 below the top metal layer, (3) the top inner metal layer 2 below the top inner metal layer 1, (4) the bottom inner metal layer 2 spaced away from and below the top inner metal layer 2, (5) the bottom inner metal layer 1 below the bottom inner metal layer 2 and (6) the bottom metal layer close to the bottom PCB surface. The top metal layer, the top inner metal layer 1 and the top inner metal layer 2 for the top parts of the coil closer to the top PCB surface and the bottom inner metal layer 2, the bottom inner metal layer 1 and the bottom metal layer form the bottom parts of the coil closer to the bottom PCB surface. Vertical conductive vias are provided and located to make electrical connections for the metal conductive lines in the 6 metal layers to form the coil. As shown in FIG. 7A, a hollow channel is formed in the PCB material between the top layers and the bottom metal layers to place the movable permanent magnet. FIGS. 7B and 7C show two different perspective side views of the example in FIG. 7A.

Figure 8A:
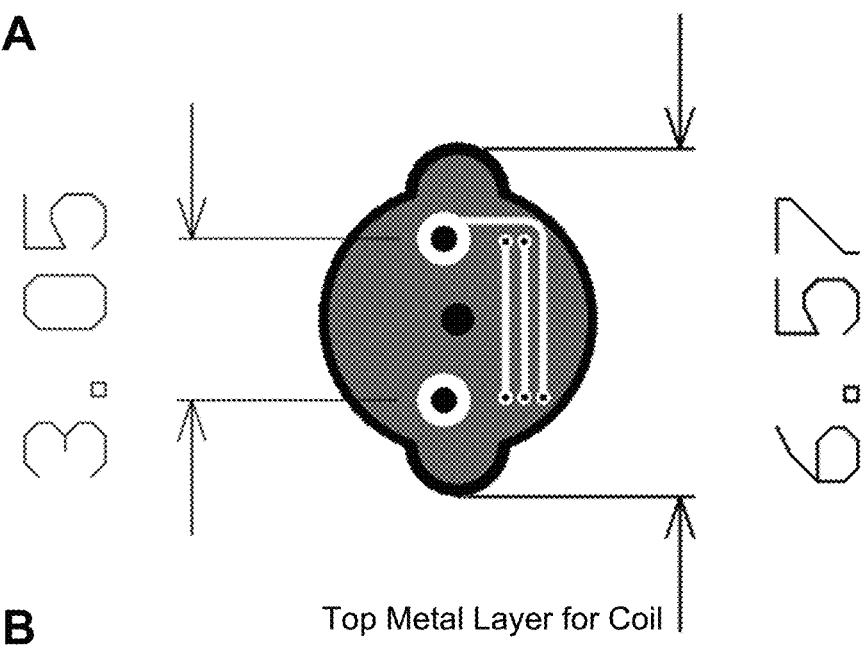
FIGS. 8A, 8B, 8C, 8D, 8E and 8F show examples of metal patterns in the 6 metal layers in the example in FIGS. 7A, 7B and 7C.
Figure 8B:
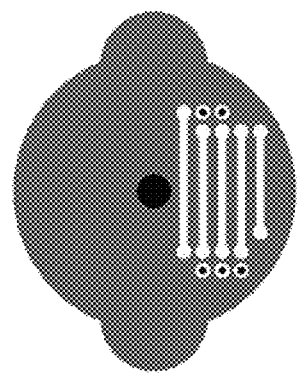
Figure 8C:
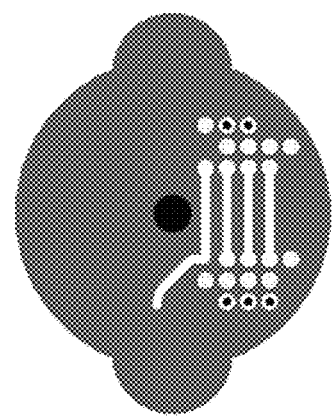
Figure 8D:
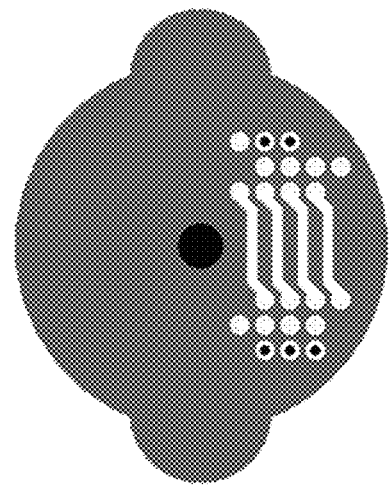
Figure 8E:
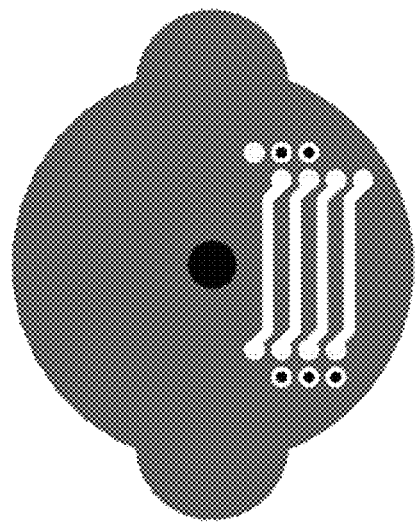
Figure 8F:
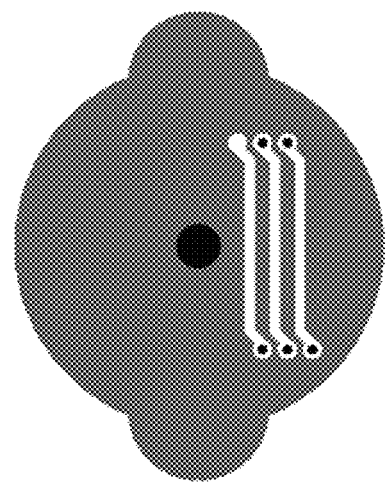

FIGS. 8A, 8B, 8C, 8D, 8E and 8F show examples of the metal patterns in the 6 metal layers in the example in FIGS. 7A, 7B and 7C. The unit of the dimensions in FIG. 8A is in millimeters.

The PCB-based optical shutter devices may be implemented to include a fail open mechanism which sets the permanent magnet in a position that opens up the optical aperture when the shutter control circuit fails. For example, a restoring spring can be used to mechanically control the position of the permanent magnet in the hollow channel for opening up the optical aperture when the current is not present in the circuit. In addition, a restoring magnet may also be used to provide such a fail open condition.

Figure 9A:
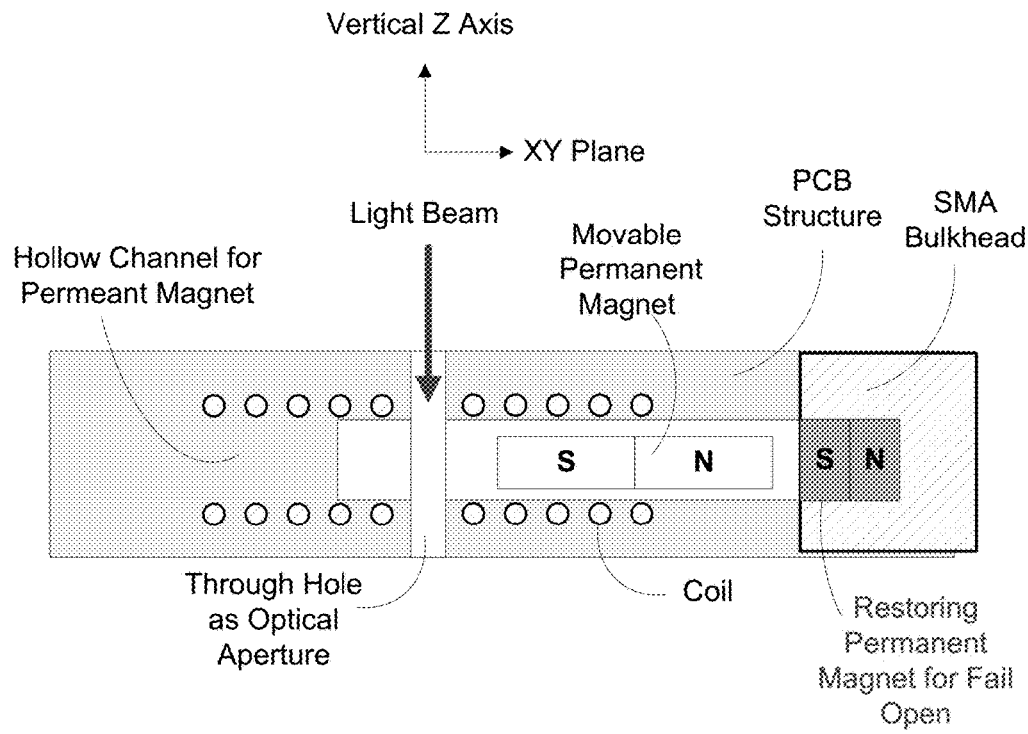
FIGS. 9A and 9B show two examples of providing a restoring magnet to implement a fail open feature where the optical shutter is open when the shutter circuit fails.
Figure 9B:
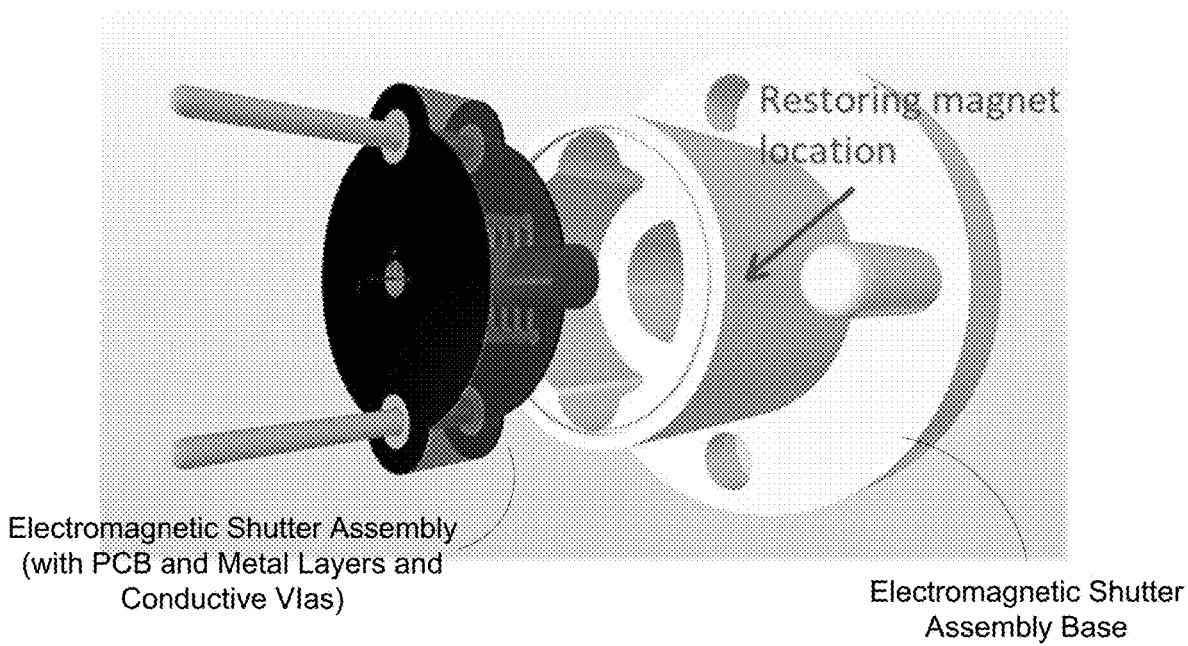

FIGS. 9A and 9B show two examples of providing a restoring magnet to implement a fail open feature where the optical shutter is open when the shutter circuit fails. In the example in FIG. 9A, a restoring permanent magnet is placed and fixed at one end of the hollow channel (such as a SMA bulkhead in an example of a SMA connector that contains the optical shutter) in which the movable permanent magnet is placed to attract to the restoring permanent magnet. For example, as shown in FIG. 9A, the North pole of the restoring permanent magnet is to face the South pole of the movable permanent magnet so that, when there is no current in the coil, the default position of the movable permanent magnet is at the restoring permanent magnet due to the magnetic pulling exerted onto the movable permanent magnet by the restoring permanent magnet to keep the movable permanent magnet away from the through hole so that the optical aperture is open. When the current is sent into the coil in the same current direction as shown in FIGS. 2A and 2B, the magnetic field produced by the coil pulls the movable permanent magnet away from the restoring permanent magnet to close the optical aperture. FIG. 9B shows another example of using a restoring permanent magnet to provide a fail open mechanism in a SMA connector design where the restoring permanent magnet is a hollow cylindrical shell its South pile on the inner side while the North pole on the outer side.

FIGS. 10A, 10B, 10C, 10D and 10E show an example of an optical shutter device formed in a printed circuit board (PCB) structure for implementing the disclosed technology to construct a planar coil with an electromagnetic induced magnetic field that is substantially perpendicular to the surface of the PCB. In this design, multiple metal layers are embedded in the PCB closer to the top PCB surface and are connected by vertical metal vias to form a coil which produces a magnetic field at a direction generally perpendicular to the top PCB surface or at acute angles with respect to the normal direction of the top PCB surface. The movable permanent magnet is placed over the top PCB surface. A housing is provided engage to the top PCB surface of the PCB structure to cover the through hole and to confine the movement of the permanent magnet around the through hole so that the permanent magnet is movable over the top PCB surface to either be away from the through hole or block the through hole. The housing is structured to allow light to be directed to the through hole in the PCB structure and may be made to include an opening or an optical window formed of an optical transparent material to allow the light to pass through the opening or the optical window to reach the through hole. FIGS. 10B, 10D and 10E show the metal patterns of four different metal layers in the PCB that are used in this example to form the coil.

In the above examples, the movable permanent magnet is moved to different positions to cause blocking or unblocking of the optical aperture. This operation can be achieved by using the movable permanent magnet to cause the blocking as shown in the illustrated examples. Alternatively, an opaque material may be attached or engaged to the movable permanent magnet to function as a beam blocker to cause blocking or unblocking of the optical aperture. FIGS. 11A and 11B illustrate one example for using such an opaque beam blocker which is attached to one end of the movable permanent magnet (e.g., the North pole end of the magnet). FIG. 11A shows that the current in the coil is controlled to move the permanent magnet in the hollow channel so that the attached beam blocker is positioned in the through hole to block the light from passing through. FIG. 11B shows the current in the coil is controlled to move the permanent magnet away from the through hole so that the attached beam blocker does not block the light from passing through the through hole. In implementations, the hollow channel can be structured to facilitate the operation by having the left end of the hollow channel closer to the through hole than the other end of the hollow channel.

Figure 12:
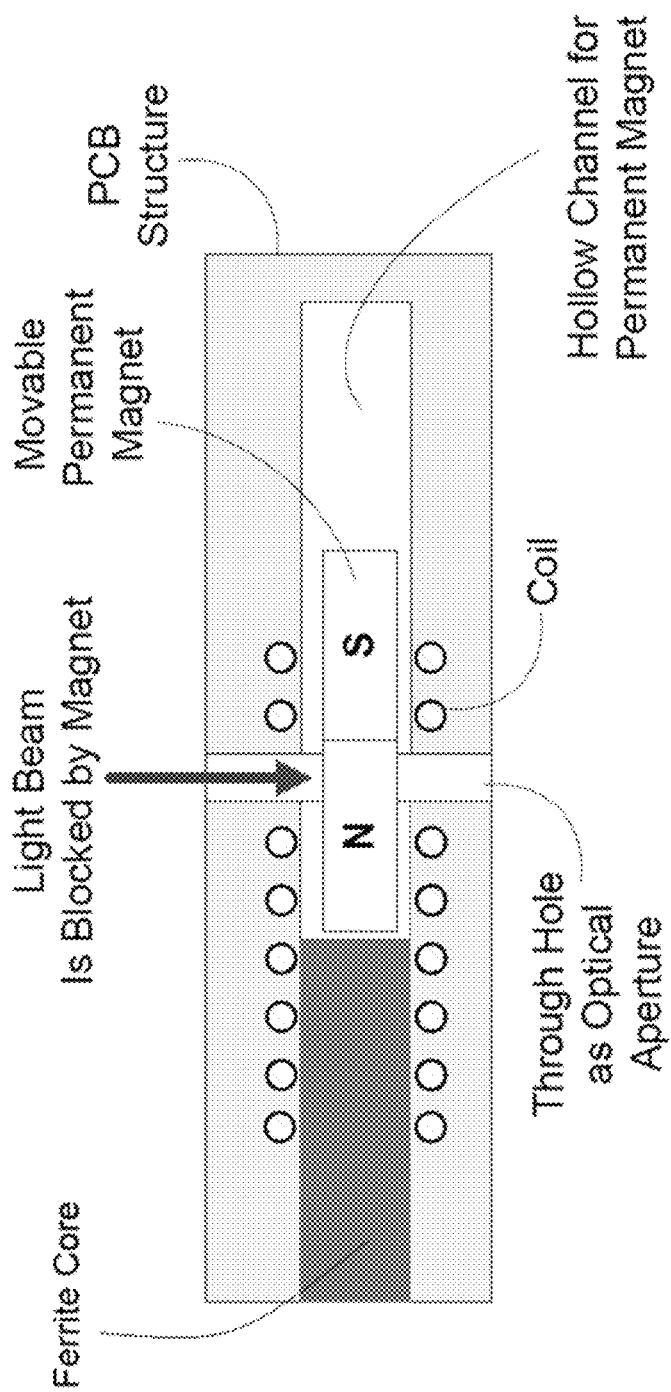
FIG. 12 shows an example of a PCB-based optical shutter device with a ferrite magnetic core in one end of the coil.

In the above examples, the coil for generating the magnetic field in response to the driving current is shown to be hollow in the drawings for the few examples. In implementations, a soft ferrite material core with a high magnetic permeability may be placed inside of part of the coil to increase the spatial density of the magnetic field lines of the magnetic field produced by the current in the coil, thus enhancing the magnetic field strength for interacting with the movable permanent magnet. Such a soft ferrite material core may exhibit a low the magnetic coercivity and a low electrical conductivity or may not be electrically conductive. Examples of suitable soft ferrite materials for such a soft ferrite material core in the disclosed technology include commercial soft ferrite materials used for transformers, inductors and other electromagnetic devices. FIG. 12 shows an example of a PCB-based optical shutter device with a magnetic core in one end of the coil to enhance the magnetic force exerted on the permanent magnet in pulling or expelling the permanent magnet for opening/closing the optical aperture. In this example, the magnetic core is placed in the coil at a location away from the space for accommodating the movement of the permanent magnet.

The above disclosed PCB-based electromagnetic optical shutter devices are simple in device structure and circuitry, robust in integrity of the device construction, reliable in device operation and compact in device size for versatile applications. In addition, the PCB structure enables the devices to be fabricated at low costs comparing to other optical shutter designs.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is what is disclosed and/or illustrated, including:

1. A device that comprises an optical shutter device for providing a shutter operation in an optical path, wherein the optical shutter device comprises:

a printed circuit board (PCB) structure formed of a PCB dielectric material and structured to include (1) first and second surfaces that oppose each other on two opposite sides of the PCB structure, (2) one or more first metal layers located at or along a first normal direction of the first surface to include first metal conductive lines, (3) one or more second metal layers located at or along a second normal direction of the second surface to include second metal conductive lines and spaced away from the one or more first metal layers by a body of the PCB dielectric material, and (4) a plurality of electrically conductive vias formed inside the PCB structure and structured and connected to provide electrical connections through the PCB dielectric material between the one or more first metal layers and the one or more second metal layers to form a coil of a winding electrical conductive path with the first and second metal conductive lines so that the coil has a coil direction parallel to the first and second surfaces, wherein the coil is connected to receive an electrical current to induce a magnetic field whose magnetic poles are controlled by a direction of the electrical current in the coil;

a channel formed in the PCB structure and located between the first and second surfaces within the coil and structured to extend along the coil direction;

a permanent magnet shaped to be placed in the channel within the coil to be movable along the channel in response to a direction and a magnitude of the electrical current in the coil; and a through hole formed in the PCB structure to penetrate through the first and second surfaces and the PCB dielectric material therebetween and located to pass through a part of the channel so that the through hole can be opened or closed as an optical shutter by a movement of the permanent magnet in the channel in response to the electrical current in the coil.

2. The device as in claim 1, wherein the PCB structure has a dimension along the first and second surfaces from 3 mm to 7 mm.

3. The device as in claim 1, wherein the channel formed in the PCB structure has a width of between 0.5 mm and 1 mm.

4. The device as in claim 1, wherein the first and second metal lines are 6 mil metal traces and the electrically conductive vias are 8 mil metal traces.

5. The device as in claim 1, wherein the PCB structure includes three or more different first metal layers and three or more different second metal layers to increase a number of turns of the winding electrical conductive path of the coil.

6. The device as in claim 1, wherein the permanent magnet is coated with an exterior coating that reduces a friction with a contact surface of the channel.

7. The device as in claim 6, wherein the exterior coating of the permanent magnet incudes a polymer coating or a metal coating.

8. The device as in claim 1, wherein the optical shutter device further includes a magnetic core inserted in at least part of the coil to enhance a strength of the magnetic field from the coil induced by the electrical current in the coil.

9. The device as in claim 1, wherein the optical shutter device further comprises:

a fixed permanent magnet fixed in position at one side of the channel that interacts with the permanent magnet movable in channel such that the permanent magnet movable in channel is placed at a location to open or close the through hole when there is no current in the coil.

10. The device as in claim 1, wherein the optical shutter device further comprises:

a spring fixed in position at one side of the channel, wherein the spring is engaged to the permanent magnet movable in channel to place the permanent magnet movable in channel at a location to open or close the through hole when there is no current in the coil.

11. The device as in claim 1, wherein the optical shutter device further comprises a fiber coupler coupled to one end of the through hole formed in the PCB structure to direct light that passes through the through hole to a fiber line that is coupled to the fiber coupler.

12. The device as in claim 1, further comprising:
an optical spectrometer coupled to the optical shutter device to receive light into the optical spectrometer.

13. The device as in claim 1, wherein the hollow channel and the permanent magnet are structured to cause blocking or unblocking of the through hole by a part of the permanent magnet.

14. The device as in claim 1, wherein the optical shutter further includes an optically opaque piece attached to one end of the permanent magnet to move along with the permanent magnet in the hollow channel, wherein the hollow channel and the permanent magnet are structured to cause blocking or unblocking of the through hole by the optically opaque piece attached to the permanent magnet.

15. A device that comprises an optical shutter device for providing a shutter operation in an optical path, wherein the optical shutter device comprises:
a printed circuit board (PCB) structure formed of a PCB dielectric material and structured to include (1) first and second surfaces that oppose each other on two opposite sides of the PCB structure, (2) a plurality of different metal layers that are separated from each other and located along a normal direction of the first surface, wherein each metal layer includes a contiguous metal trace structured as a spiral, and (3) a plurality of electrically conductive vias formed inside the PCB structure and structured and connected to provide electrical connections through the PCB dielectric material to connect the spirals of the contiguous metal traces of different metal layers in series, wherein the spirals of the contiguous metal traces of different metal layers in series are coupled to receive an electrical current to induce a magnetic field whose magnetic poles are controlled by a direction of the electrical current;
a permanent magnet placed over the first surface of the PCB structure to be movable over the first surface in response to a direction and a magnitude of the electrical current;
a through hole formed in the PCB structure to penetrate through the first and second surfaces and the PCB dielectric material therebetween so that the through hole can be opened or closed as an optical shutter by a movement of the permanent magnet in response to the electrical current; and
a housing engaged to the first surface of the PCB structure to cover the through hole and to confine the movement of the permanent magnet around the through hole so that the permanent magnet is movable over the first surface to either be away from the through hole or block the through hole, wherein the housing is structured to allow light to be directed to the through hole.

16. The device as in claim 15, wherein the permanent magnet is coated with an exterior coating that reduces a friction with the first surface.

17. The device as in claim 15, wherein the optical shutter device further includes a magnetic core inserted in at least part of the coil to enhance a strength of the magnetic field from the coil induced by the electrical current in the coil.

18. The device as in claim 15, wherein the permanent magnet is structured to cause blocking or unblocking of the through hole by a part of the permanent magnet.

19. The device as in claim 15, further comprising an optically opaque piece attached to the permanent magnet to move along with the permanent magnet to cause blocking or unblocking of the through hole by the optically opaque piece attached to the permanent magnet.

* * * * *